United States Patent [19]
Blind et al.

[11] Patent Number: 5,469,510
[45] Date of Patent: Nov. 21, 1995

[54] ARBITRATION ADJUSTMENT FOR ACOUSTIC REPRODUCTION SYSTEMS

[75] Inventors: Henry F. Blind, Grosse Pointe Woods; Anthony J. Campagne, Brighton; James L. Czekaj, Madison; Nicholas L. Difiore, Farmington Hills; Earl R. Geddes, Livonia; Andrew C. Krochmal, Canton; Myron I. Senyk, Sterling Heights, all of Mich.

[73] Assignee: Ford Motor Company, Dearborn, Mich.

[21] Appl. No.: 82,633

[22] Filed: Jun. 28, 1993

[51] Int. Cl.[6] ................................................ H03G 11/00
[52] U.S. Cl. ........................................ 381/55; 381/71
[58] Field of Search ........................... 381/71, 55, 94, 381/103, 104, 105, 106, 107, 108, 109, 96, 28; 330/14, 2

[56] References Cited

U.S. PATENT DOCUMENTS

| | | | |
|---|---|---|---|
| 4,048,573 | 9/1977 | Evans et al. | 330/2 |
| 4,677,676 | 6/1987 | Eriksson | 381/71 |
| 4,891,605 | 1/1990 | Tirkel | 330/279 |
| 4,912,424 | 3/1990 | Nicola et al. | 330/141 |
| 4,978,926 | 12/1990 | Zerod et al. | 330/279 |
| 5,001,440 | 3/1991 | Zerod | 330/284 |
| 5,068,620 | 11/1991 | Botti et al. | 330/2 |
| 5,175,508 | 12/1992 | Gingrich et al. | 330/84 |
| 5,278,913 | 1/1994 | Delfosse et al. | 381/71 |

*Primary Examiner*—Curtis Kuntz
*Assistant Examiner*—Huyen D. Le
*Attorney, Agent, or Firm*—Mark L. Mollon; Roger L. May

[57] ABSTRACT

An acoustic production system having multiple signal sources and a power amplifier driving an acoustic transducer such as a loudspeaker includes an arbitrator in a power limiter circuit to selectively limit the input level of one of the sources to the power amp in response to an overdrive signal from the amplifier. The input level to the power amplifier is automatically reduced in response to the overdrive signal until a predetermined level of limiting has been attained. Once the predetermined level of limiting is reached, the arbitrator outputs a second overdrive signal to prompt additional limiting of the power amplifier output. Preferably, the arbitrator is included in an interior active noise cancellation module combined with an audio entertainment system for a passenger compartment of a motor vehicle. The audio system also preferably separates the audio reproduction into high frequency and low frequency branches, whereby the arbitrator acts upon the signals output in the frequency ranges of active noise cancellation and the bass output of the audio entertainment system that are most likely to overdrive an amplifier.

8 Claims, 3 Drawing Sheets

ARBITRATION ADJUSTMENT FOR ACOUSTIC REPRODUCTION SYSTEMS

FIELD OF THE INVENTION

The present invention relates generally to acoustic production systems, and more particularly to a DSP system arbitrating audio reproduction and active noise cancellation for selectively limiting power amplifier output.

BACKGROUND ART

To improve acoustic reproduction systems, digital signal processing (DSP) systems have been used to control processing of input signals to generate drive signals for the acoustic production emitted by a loudspeaker.

One previously known form of acoustic production system comprises an active noise control (ANC) production system. Such a system may be conveniently employed in the passenger compartment of the motor vehicle to compensate for the noise of the power train as well as road noise generated as the vehicle travels. In such a system, a sensed signal is input to an adaptive filter that generates an opposing phase signal that cancels out the sensed primary noise signal.

Another known production system often used in vehicles comprises an audio entertainment reproduction system. Since both the audio entertainment system and an interior active noise cancellation system operate to affect the sounds perceived by passengers in the passenger compartment, it would readily appear desirable to consolidate both systems using the same output transducer, for example, one or more loudspeakers, within the passenger compartment to perform both functions. Moreover, the structural simplicity of DSP components and the ease of functional changeover by software modification, renders the combination of noise cancellation and audio reproduction a most practical combination.

Nevertheless, the use of a single power amplifier to drive the transducers in response to both active noise cancellation signals and audio reproduction signals may overdrive the power amplifier and substantially disrupt the signal being delivered to or emanating from the loudspeakers.

In order to avoid distortion in the amplified signals and acoustic response when signal peaks of the output of the overdriven power amplifier are clipped, it has been known to detect the clipping of the output signal and then limit the input to the amplifier or the gain of the amplifier in order to eliminate the clipping and the resultant distortion. For example, U.S. Pat. Nos. 5,001,440, 5,068,620, 4,048,573 disclose apparatus for detecting and limiting clipping of amplifier outputs. U.S. Pat. No. 4,912,424 also recognized that wideband input signal limitation may be undesirable because all frequencies may be attenuated, although only signals in the bass frequency range generate the clipping output. Thus the patent disclosed a process to limit the bass range and the wide band output separately through a bass limiting loop as well as the volume or treble limiting loop. Moreover, bass boost is generally used in an automotive environment to mask low frequency road and engine noise, making clipping more likely in the audio signal environment of a motor vehicle.

In addition, interior active noise cancellation in motor vehicles involves low frequency or bass range signal generation. In such systems, it has been known to employ a power limiter loop. For example, Digisonix DX Model 47 active noise controller processes a correction signal and alters it with a system modeling characteristics filter, including step sizing updates to the adaptive filter, as well as limiting the secondary noise signal or cancellation output to be introduced into the power amplifier. However, such a system is limited to the active noise cancellation circuit and does not limit the input that may be provided by another signal source input to the power amplifier. Moreover, it will be disadvantageous to limit both signal sources at the same rate, especially since the limitation of an output from an audio entertainment reproduction source may be subjectively more noticeable to the occupants of the motor vehicle than the active noise cancellation output of the transducer.

SUMMARY OF THE INVENTION

The present invention overcomes the above mentioned disadvantages by providing an arbitrator for a multiple source input for a power amplifier that drives acoustic production transducers. The arbitrator directs one of the multiple sources to deliver limited input to the power amplifier before limiting output of the power amplifier as driven by the input of the other source. Preferably, distortion produced by the clipping of the output signal from the power amplifier is sensed to generate a clip detect signal introduced to the ANC module where it is processed to limit the output of the ANC module to the power amplifier input. In addition, a return clip detect signal is preferably coupled from the ANC module to the power amplifier so that when the ANC module has reached a predetermined limit of cancellation signal input to the power amplifier, a signal for additional limitation of the power amplifier output due to input from other sources is processed.

In the preferred embodiment, an active noise cancellation module receives the clip detect signal from a power amplifier employed in a bass reproduction system of an acoustic production system of a motor vehicle. Moreover, the preferred ANC module includes adaptive filters for generating a cancellation signal from a reference signal and for modeling the error path from the output of the control system to the error signal input, for example, through the amplifier, loudspeaker and microphone sensing the noise to be cancelled. Preferably, the output from the active noise cancellation module is generated by subtracting a noise signal from a control signal. The control signal is generated by continuous on-line modeling in the first adaptive filter. The cancellation output signal compensates for the system noise by the second adaptive filter that employs continuous on-line modeling of the errors introduced by the transduction path. A power limiter receives the control signal for filtering through a copy of the error path modeling filter, and its output is added to the measured error signal generated from the noise sensing microphone to continuously update the first adaptive filter producing the control signal. The power limiter includes the arbitrator, preferably implemented by digital signal processing in accordance with an algorithm implemented in the controlling software.

Thus, the present invention provides a power limiter in a signal source module employing an arbitrator for limiting the module's input to a power amplifier serving multiple sources before limiting the power output due to inputs from the other sources. In addition, the present invention provides an active noise cancellation module which produces a limited cancellation signal in response to a clip detect indication from a power amplifier. The module also provides additional processing to automatically adjust the attenuation factor as periodically necessary, as well as providing a clip detect signal for additionally limiting the output of the power amplifier to the extent that a predetermined level of limitation has been imposed upon the active noise cancellation signal from the module.

Furthermore, the present invention provides an acoustic production system, preferably including audio sources as well as an active noise cancellation source, in which at least a portion, such as a low frequency or bass reproduction portion of the audio system, is segregated as having a high level of distortion generating sources and including a power limiter, for example, in a segregated generating source. Furthermore, the combination of an audio reproduction system with an active noise cancellation module utilizing a single power amplifier according to the present invention restricts a subjectively annoying acoustic production by imposing a maximum limitation upon the active noise cancellation input to the power amplifier before affecting the audio entertainment signals driving the loudspeakers in the acoustic production system. Moreover, the system of the present invention enhances the stability of the ANC controller to improve integrity and control of the acoustic output from the loudspeakers. Furthermore, the system does not require substantial additional hardware that generally causes packaging problems generally associated with additional equipment.

BRIEF DESCRIPTION OF THE DRAWINGS

The present invention will be more clearly understood by reference to the following detailed description of a preferred embodiment, when read in conjunction with the accompanying drawing in which like reference characters refer to like parts throughout the views, and in which.

DETAILED DESCRIPTION OF THE PREFERRED EMBODIMENT

Figure 1:
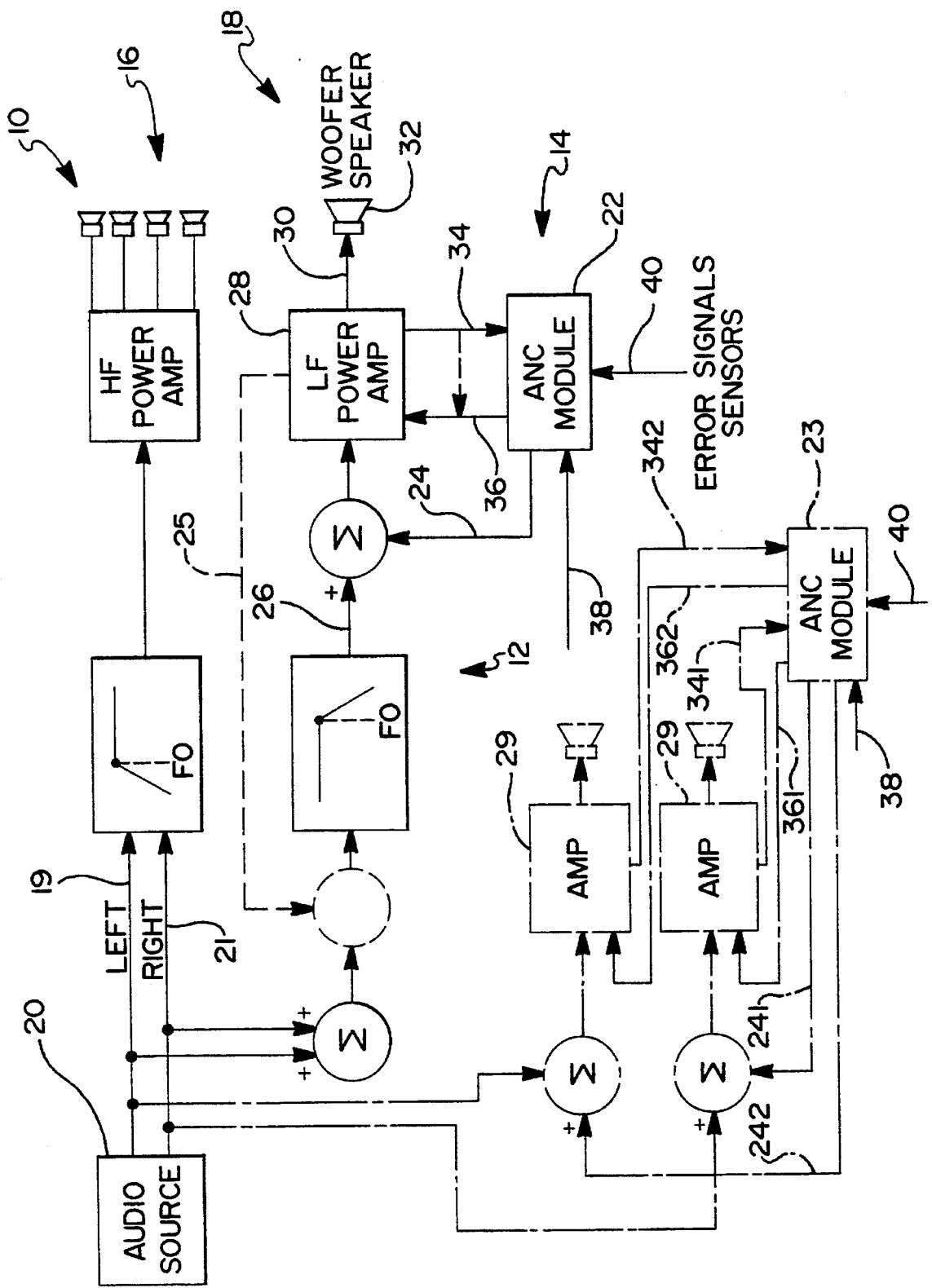
FIG. 1 is a diagrammatic view of an acoustic production system for use in a motor vehicle passenger compartment and constructed in accordance with the present invention.

Referring first to FIG. 1, an acoustic production system 10 is there shown comprising an audio reproduction system 12 and an interior active noise cancellation system 14 in combination. The audio reproduction system 12 includes a high frequency power branch 16 as well as a low frequency power branch 18 operating in response to an audio source 20. The audio source 20 comprises one or more entertainment media controls, such as a radiowave receiver, a compact disc player, a cassette tape player unit or the like, providing stereo transmission of left and right signals to both high pass and low pass filters for entry into the high frequency power branch 16 and low frequency power branch 18, respectively. In addition, the low frequency power branch 18 includes an active noise cancellation (ANC) module 22.

Nevertheless, other acoustic production system designs can use the arbitration scheme of the present invention. For example, as shown in phantom line in FIG. 1, each of the left channel signal 19 and the right channel signal 21 may be directed to a separate amplifier 29 and transducer combination without band pass filtering. In such a design, the ANC module 23 may provide an input to each of the separate channel amplifiers. As will be described in greater detail throughout the application, the ANC module 22 or 23 produces cancellation output 24 which is input with the output of the audio source 20 for introduction into a power amplifier, for example, the power amplifier 28 of the low frequency power branch 18 in the preferred embodiment, or the separate channel amplifiers 29 shown in phantom line in FIG. 1. The power amplifier 28 provides a drive signal 30 to one or more speakers representing the transducer 32, for example, the woofer speaker for acoustic production of the lower frequency signals.

The ANC module 22 interacts with the power amplifier 28 by means of a clip detect signal 34 generated in a conventional manner with an audio power amplifier I.C. such as with a TDA 7360 to introduce a binary signal representing the clip detect response into the ANC module 22. Similarly, the ANC module 22 interacts with the power amplifier 28 to signal when a predetermined or maximum level of signal power limitation is imposed upon the output 24, but without otherwise responding to the clip detect signal 34. As will be discussed hereinafter, the ANC module 22 generates the secondary source signal or cancellation output 24 in response to an adaptively filtered primary noise signal, for example, a reference signal 38, adjusted by an adaptively filtered and sensed error signal 40.

Figure 2:
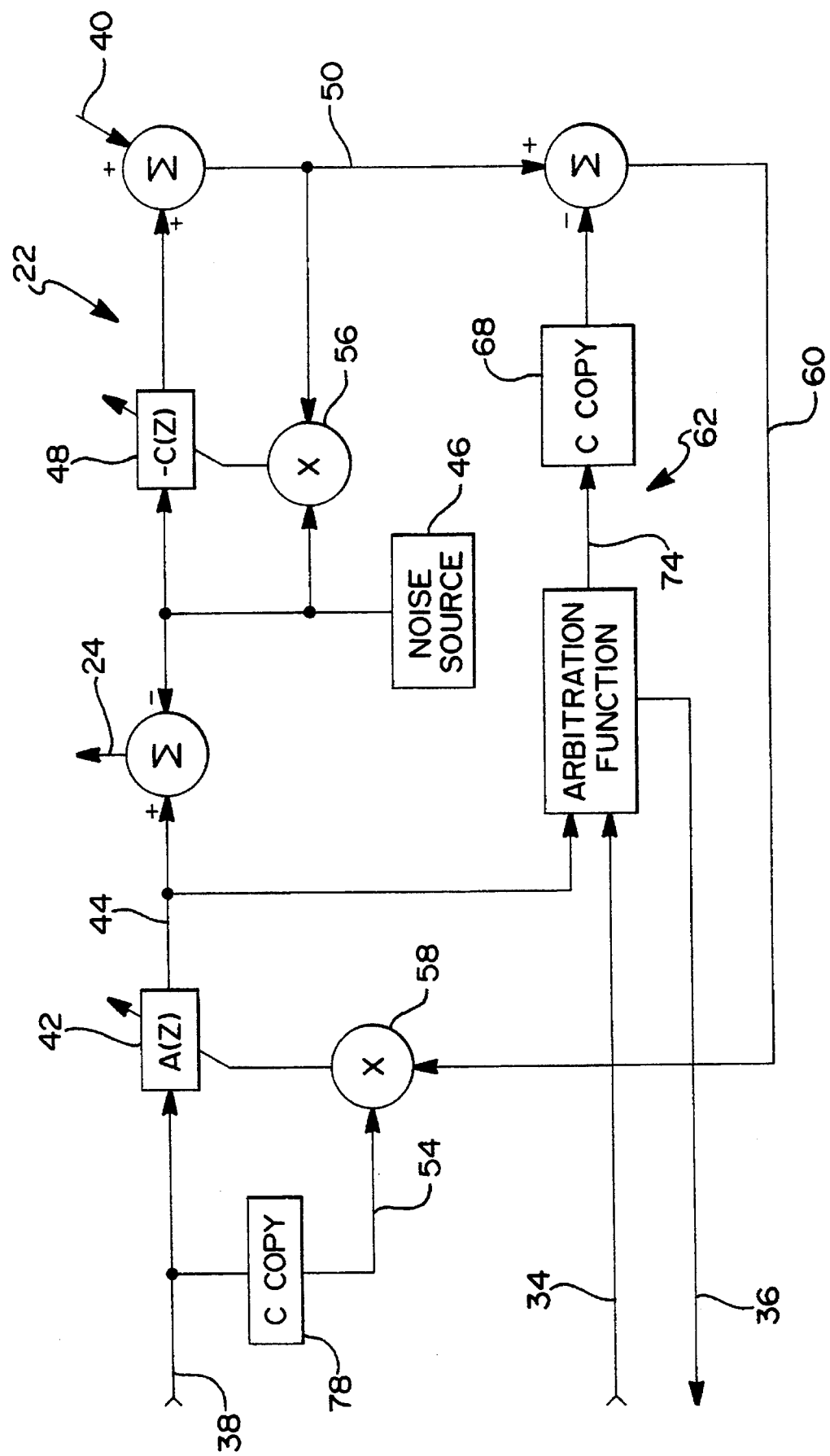
FIG. 2 is a diagrammatic representation of an active noise cancellation module shown in the system of FIG. 1.

As best shown in FIG. 2, the ANC module 22 produces output in response to the primary noise signal, such as the reference signal 38 that is synchronized to the engine rotation, or any other signal correlated with the noise to be affected by the cancellation signal to be generated by the module 22. Reference signal 38 is introduced into the adaptive filter 42 used to generate an output 44 to be used in the canceling signal 24. The cancellation signal 24 includes the output 44 but has a noise 46 added to it that is utilized in the modeling of the system error path. The noise 46 comprises a pseudo-random binary data stream that is used as a signal source to model the error path and obtain the error path model filter 48. The filter 48 creates the transfer function C(z) that represents the error path occurring through the amplifier 28, transducer 32 and the transducer, for example, one or more microphones, generating at least one measured error signal 40.

Each of the adaptive filters 42 and 48 employ coefficients whose values are updated every sample period as may be determined to be desirable. C(z) is updated every sample period using the noise signal 46 and a signal 50 representing the measured error signal 40 with the noise effects modeled by filter 48. These signals are processed with a predetermined step size to update filter 48 in appropriate empirical increments that avoid extremely slow filter response on one hand, and uncontrollable filter variation on the other hand. Filter 42 is updated in a similar manner with inputs comprising an error signal 60 and a filtered signal 54 resulting from the reference signal 38 being filtered by a copy 78 of the filter 48, and likewise processed according to a predetermined step size. The error signal 60 results from error signal 50 being added to the output of a power limiter 62 determining the amount of energy of control signal 44 transmitted through the digital error path. The gain of the power limiter 62 before filtering by a copy 68 of filter 48 is K, whereby the value of K determines the amount of energy of output signal 44 that goes through the digital error path. The control signal 44 is amplified by the gain K to generate a limiting control signal 74. As a result, the overall power amplifier output is attenuated at about 1/(K+1).

Figure 3:
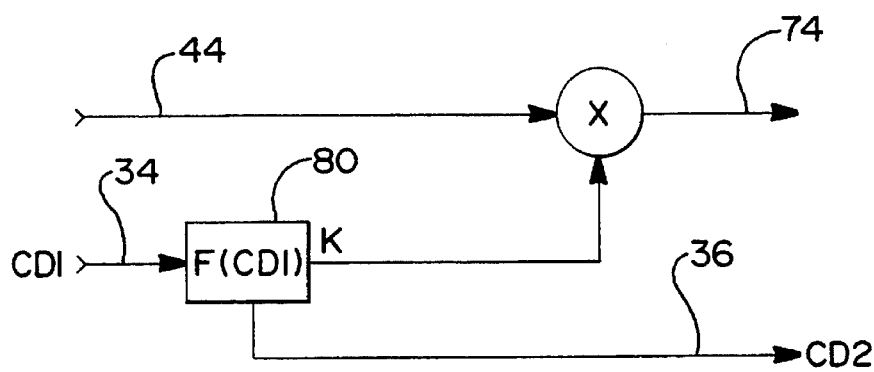
FIG. 3 is a diagrammatic representation of an arbitrator used in the module shown in FIG. 2.
Figure 4:
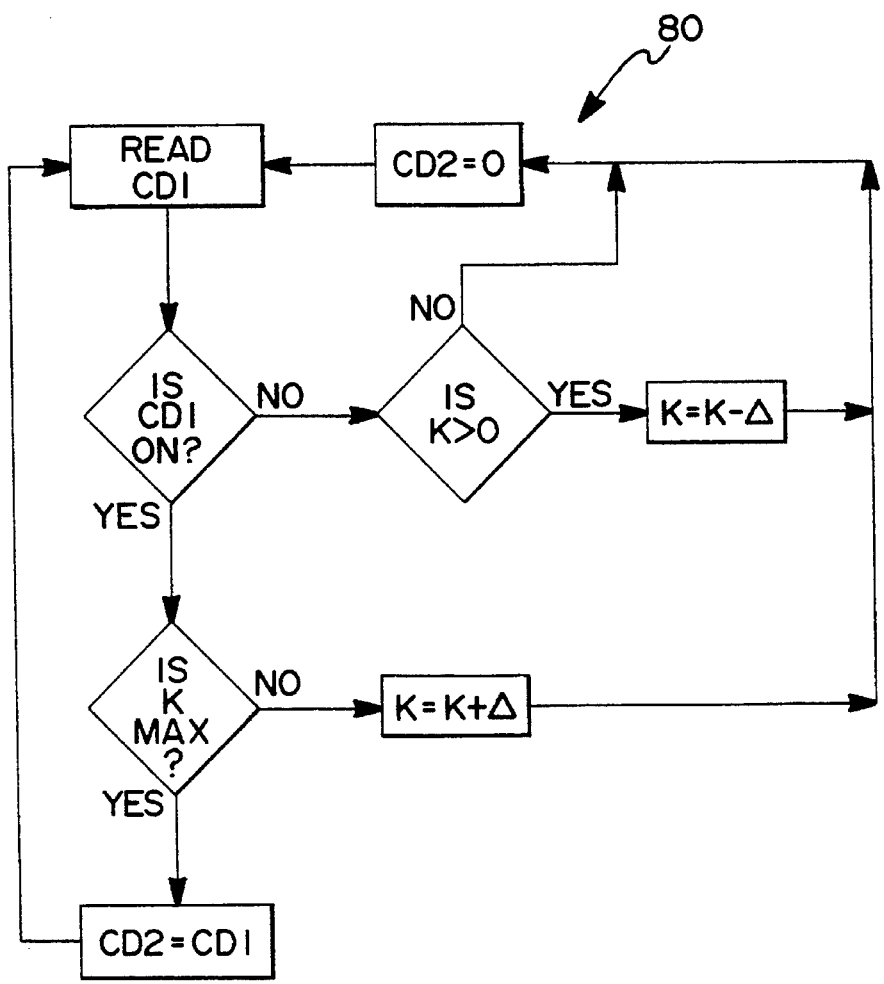
FIG. 4 is a diagrammatic flow chart representation of an algorithm controlling the signal processor of the arbitrator shown in FIG. 3.

Referring now to FIG. 3, the constant K used in determining the gain of the power limiting control 62 producing signal 74 is a function of the clip detect signal 34 (CD1). As best shown in FIG. 4, the constant K as a function of the clip detect signal 34 is determined by an algorithm logically updating whether only the cancellation output 24 from the active noise cancellation module 22, or both the cancellation output 24 and the first source signal 26 generated from the audio entertainment system 12, are to be affected by compensation for overdriving the power amplifier 28.

Whenever the clip detect signal 34 is off, but the constant K is greater than 0, the constant K will be incrementally decreased by a predetermined amount Δ and the clip detect output 36 (CD2) will be maintained at 0. If the clip detect signal 34 is on, but the constant K is not yet at a predetermined maximum value, K will be incrementally increased by a predetermined amount, for example, an amount Δ, while the clip detect output 36 from the ANC module 22 to the power amplifier 28 remains at an off or 0 level. In either event, the amount Δ that K is changed may also be made variable depending on the application. For example, Δ may need to be variable to assure stability of power limiting near the limit of amplifier signal clipping or changed between increasing or decreasing K. Nevertheless, once K has reached a predetermined maximum level, and the amplifier 28 continues to signal that the clip detect signal 34 is on, the clip detect signal 36 will be transmitted from the ANC module 22 to the power amplifier 28.

The clip detect signal 36 is an indication of the need for additional limiting of the output of the power amplifier 28. The limitation may be provided by limiting the first source signal 26 input to the power amplifier 28. An example of a circuit for limitation of the audio reproduction input which can be used to avoid a clipped amplifier output is shown in U.S. Pat. Nos. 4,912,424, 4,978,926 and 5,001,440, incorporated by reference in this disclosure, and diagrammatically shown at feedback gain loop 25 in FIG. 1. An alternative example of amplifier output limitation is shown in the variable-gain amplifier of U.S. Pat. No. 5,175,508, also incorporated by reference in this disclosure.

As a result, the acoustic production system 10 of the preferred embodiment improves performance by restricting the output in the frequency range most likely to cause clipping of the output from the power amplifier. Moreover, the limitation may be controlled in a manner which is least noticeable or objectionable to occupants of the area in which the system is employed. As a result, the invention is particularly well adapted for use in motor vehicle passenger compartments in conjunction with both audio entertainment and interior active noise cancellation systems. Furthermore, the arbitrator of the present invention is readily incorporated in the motor vehicle without extensive equipment additions or additional power source requirements. Moreover, the invention substantially enhances the versatility and utility of DSP components that may already be employed in the vehicle, for example, in a DSP audio reproduction system.

Having thus described the present invention, many modifications thereto will become apparent to those skilled in the art to which it pertains, without departing from the scope and spirit of the present invention as defined in the appended claims.

We claim:

1. An acoustic production system comprising:

first and second independent signal sources providing first and second independent signal inputs respectively;

a power amplifier for generating a drive signal responsive to both source signal inputs;

a transducer for acoustically transmitting a response to said drive signal;

a clip detector for generating a clip detect signal when said drive signal is clipped; and an arbitrator for selectively limiting the drive signal by limiting the source signal input to said amplifier from one of said first and second independent signal source inputs by reducing a first input of said first and second source signals to said power amplifier and reducing the output of both said first and second input signals to said power amplifier after said first input is limited to a predetermined level in response to said clip detect signal.

2. An acoustic production system as defined in claim 1 wherein said arbitrator comprises a power limiter in said one of said first and second signal independent signal sources.

3. An acoustic production system as defined in claim 1 wherein said first independent signal source input comprises an active noise cancellation generator and said second independent signal source input comprises an audio entertainment source.

4. An active noise cancellation module for generating an active noise cancellation output in response to a primary noise signal, a sensed error signal, and a clip detect signal from a power amplifier the module comprising:

a primary noise signal input;

a cancellation filter for generating a control signal in response to said primary noise signal input;

an error signal input representing the noise to be cancelled;

a modeling filter for generating a system error signal in response to said error signal;

a noise generator for producing a pseudo-random bit stream noise signal;

a subtractor for generating an active noise cancellation output by generating a difference signal from said control signal and said bit stream signal; and a power limiter for controlling the output level of said active noise cancellation output wherein said power limiter includes an arbitrator for adjusting the gain of the power limiter up to a predetermined limit level, and generating a second clip detect signal when said predetermined limit level is achieved and the power amplifier clip detect signal remains active.

5. The active noise cancellation module as defined in claim 4 wherein said cancellation filter is continuously updated in response to said error signal input, a copy of said system error signal and a step size convergence parameter.

6. An active noise cancellation module as defined in claim 4 wherein said modeling filter is continuously updated in response to said noise signal, said error signal input and a step size convergence parameter.

7. A power limiter for an acoustic production system having two independent signal sources sharing a common amplifier for driving a transducer, and means for signaling an overdrive condition in the amplifier, the power limiter comprising:

a control signal output from a filtered reference signal;

a filter, receiving the control signal output, for modeling an error path of at least a portion of the production system and producing a power limited version of the control signal output; and an arbitration control for monitoring said signaling an overdrive condition and reducing the power limited version of the control signal output in response to the signaling an over drive condition until a predetermined limit of reduced power limitation has been reached, and generating a limitation signal for the common amplifier in response to the signaling an over drive condition when said predetermined limit of reduced power limitation has been reached and said signaling an overdrive condition continues.

8. An acoustic production system comprising:

first and second signal sources providing first and second signal inputs respectively;

a power amplifier for generating a drive signal responsive to both source signal inputs;

a transducer for acoustically transmitting a response to said drive signal;

a clip detector for generating a clip detect signal when said drive signal is clipped;

an arbitrator for selectively limiting the drive signal by limiting the source signal input to said amplifier from one of said first and second signal source inputs by reducing a first input of said first and second source signals to said power amplifier and reducing the output of both said first and second input signals to said power amplifier after said first input is limited to a predetermined level in response to said clip detect signal; and wherein said first signal source input comprises an active noise cancellation generator and said second signal source input comprises an audio entertainment source.

* * * * *